US009589976B2

(12) United States Patent
Tseng et al.

(10) Patent No.: US 9,589,976 B2
(45) Date of Patent: Mar. 7, 2017

(54) STRUCTURE AND METHOD TO REDUCE POLYSILICON LOSS FROM FLASH MEMORY DEVICES DURING REPLACEMENT GATE (RPG) PROCESS IN INTEGRATED CIRCUITS

(71) Applicant: Taiwan Semiconductor Manufacturing Co., Ltd., Hsin-Chu (TW)

(72) Inventors: Yuan-Tai Tseng, Zhubei (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/688,201

(22) Filed: Apr. 16, 2015

(65) Prior Publication Data

US 2016/0307909 A1    Oct. 20, 2016

(51) Int. Cl.

| | | |
|---|---|---|
| *H01L 29/788* | (2006.01) | |
| *H01L 29/423* | (2006.01) | |
| *H01L 27/12* | (2006.01) | |
| *H01L 27/01* | (2006.01) | |
| *H01L 27/115* | (2006.01) | |
| *H01L 21/28* | (2006.01) | |
| *H01L 23/48* | (2006.01) | |
| *H01L 29/88* | (2006.01) | |
| *H01L 21/306* | (2006.01) | |

(52) U.S. Cl.
CPC .... *H01L 27/1157* (2013.01); *H01L 21/28282* (2013.01); *H01L 21/30625* (2013.01); *H01L 27/11573* (2013.01); *H01L 29/42344* (2013.01)

(58) Field of Classification Search
CPC .......... H01L 27/1157; H01L 21/28282; H01L 21/30625; H01L 27/11573; H01L 29/42344
USPC ................................. 257/320–330
See application file for complete search history.

(56) References Cited

U.S. PATENT DOCUMENTS

| | | | |
|---|---|---|---|
| 2008/0029805 A1* | 2/2008 | Shimamoto | H01L 21/28282 257/315 |
| 2011/0095348 A1* | 4/2011 | Chakihara | H01L 21/28273 257/298 |
| 2014/0167141 A1 | 6/2014 | Ramsbey et al. | |

(Continued)

FOREIGN PATENT DOCUMENTS

JP    2016012674 A  *  6/2014  ........ H01L 27/11568

*Primary Examiner* — Marc Armand
*Assistant Examiner* — Nelson Garces
(74) *Attorney, Agent, or Firm* — Eschweiler & Associates, LLC (57) ABSTRACT

The present disclosure relates to an integrated circuit (IC), including, a flash memory device region, including a pair of split-gate flash memory cells arranged over a semiconductor substrate. The pair of split gate flash memory cells respectively have a control gate (CG) including a polysilicon gate and an overlying silicide layer. A periphery circuit including, one or more high-k metal gate (HKMG) transistors are arranged over the semiconductor substrate at a position laterally offset from the flash memory device region. The one or more HKMG transistors have a metal gate electrode with an upper surface that is lower than an upper surface of the silicide layer. A method of manufacturing the IC is also provided.

20 Claims, 8 Drawing Sheets

(56) References Cited

U.S. PATENT DOCUMENTS

2014/0227843 A1* 8/2014 Tsukamoto ......... H01L 29/6659
438/275
2015/0380425 A1* 12/2015 Ogata ............... H01L 21/28282
257/324

* cited by examiner

STRUCTURE AND METHOD TO REDUCE POLYSILICON LOSS FROM FLASH MEMORY DEVICES DURING REPLACEMENT GATE (RPG) PROCESS IN INTEGRATED CIRCUITS

BACKGROUND

The semiconductor manufacturing industry has experienced exponential growth over the last few decades. In the course of semiconductor evolution, the minimum feature sizes for semiconductor devices has decreased over time, thereby helping to increase the number of semiconductor devices per unit area on successive generations of integrated circuits (ICs). This device "shrinkage" allows engineers to pack more devices and more corresponding functionality onto newer generations of ICs, and is consequently one of the underlying drivers of the modern digital age. Another advancement that has helped improve the functionality of ICs has been to replace traditional polysilicon gates with metal gates, and to replace traditional silicon dioxide gate dielectrics with so called high-κ dielectrics. Whereas silicon dioxide has a dielectric constant of approximately 3.9, high-κ dielectrics have a dielectric constant of more than 3.9, which helps to reduce gate leakage and allows faster switching for transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in the semiconductor manufacturing industry is to integrate different integrated chip components (e.g., types of semiconductor devices) onto a single integrated circuit (IC). Such integration can advantageously lower manufacturing costs, simplify manufacturing procedures, and increase performance of the final product. Embedded flash memory, which can integrate flash memory cells with other types of semiconductor devices, is one example of a technology where integration is advantageous.

Traditional flash memory cells and corresponding logic devices are formed with polysilicon gates insulated by silicon dioxide gate dielectric layers. As semiconductor feature sizes get smaller, however, the logic devices of such embedded flash memory devices are reaching performance limits. Accordingly, high κ metal gate (HKMG) technology has become one of the front runners for the logic devices in the next generation of embedded flash memory devices. HKMG technology employs a metal gate separated from the underlying substrate by a material with a high dielectric constant κ (relative to silicon dioxide). The high κ dielectric reduces leakage current and increases the maximum drain current, and the metal gate mitigates the effects of Fermi-level pinning and allows the gate to be employed at lower threshold voltages. Further, the high κ dielectric and the metal gate collectively reduce power consumption. Thus, the aim for future generations of embedded flash memory is to integrate flash cells having polysilicon gates with HKMG logic devices.

In a traditional HKMG replacement gate process (RPG), a chemical mechanical polishing (CMP) operation usually planarizes features above a semiconductor substrate, to a height corresponding to an upper surface of a sacrificial polysilicon gate of a logic device. In an embedded flash memory cell, this CMP process will result in a flash memory device having a relatively thin polysilicon control gate (CG) region since the CG region usually resides over a charge trapping layer above the semiconductor substrate. For the purpose of reducing contact resistance, a silicide layer is formed over top surfaces of the polysilicon CG region in a memory contact pad region, following the CMP process and prior to forming the contacts. In this scenario, the relatively thin polysilicon of the CG region may lead to full silicide formation along a length of the CG region, causing leakage of charge from the CG to the substrate.

Accordingly, the present disclosure is directed to an improved structure and method of semiconductor manufacturing that limits or prevents thinning of the CG region in a memory contact pad region. The improved method comprises retaining a hard mask (usually SiN (silicon nitride))

over a polysilicon CG region and performing a selective etch to remove an oxide hard mask covering sacrificial polysilicon gates within HKMG logic devices within a periphery region. Subsequently, an interlayer dielectric (ILD) layer is formed above the semiconductor substrate and a CMP process is performed to thin down the ILD layer and expose the sacrificial polysilicon gates. However, the flash memory devices remain protected by the hard mask during the CMP process, and thus polysilicon loss is mitigated to ensure a sufficient polysilicon thickness for the CG region to prevent complete silicide formation along a thickness of the CG. The resulting embedded flash memory device comprises one or more HKMG transistors having a metal gate electrode with an upper surface that is lower than an upper surface of a silicide layer formed in the polysilicon CG region.

Figure 1:
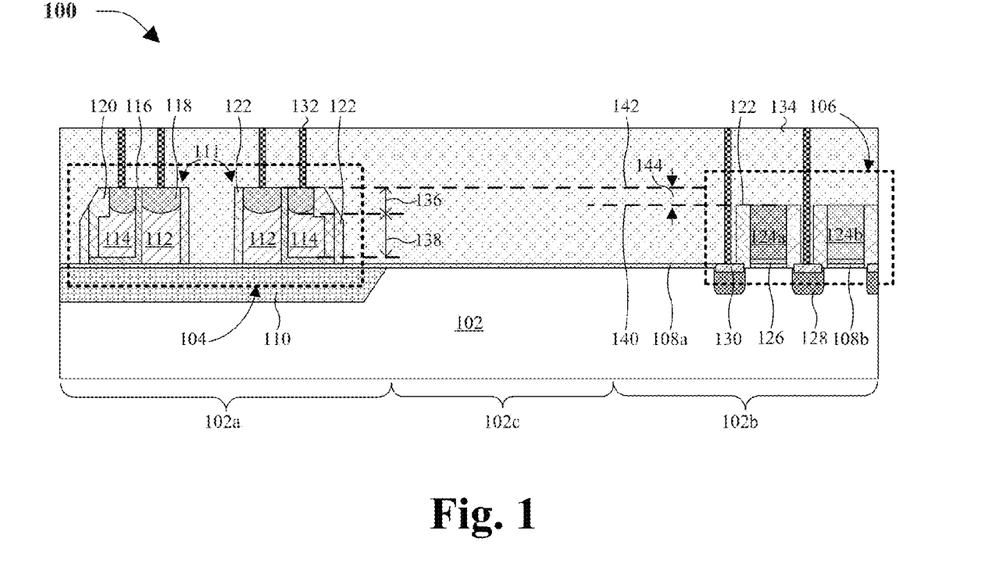
FIG. 1 illustrates a cross-sectional view of an integrated circuit, including a flash memory device region and a periphery region, according to some embodiments of the present disclosure.

With reference to FIG. 1, a cross-sectional view 100 of an integrated circuit (IC) including a flash memory device region and a periphery region is provided, according to some embodiments of the present disclosure. The IC includes a semiconductor substrate 102 (e.g., a silicon substrate, and SOI substrate, etc.), which has a memory contact pad region 102a and periphery region 102b laterally separated from the memory contact pad region 102a. In some embodiments, the periphery region 102b may be separated from the memory contact pad region 102a by a dummy region 102c comprising one or more dummy structures (not shown).

A flash memory device region 104 is arranged above the memory contact pad region 102a and a periphery circuit 106 is arranged above the periphery region 102b. A first base dielectric layer 108a that extends along the memory contact pad region 102a and the dummy region 102c, and a second base dielectric layer 108b, that extends along the periphery region 102b, are disposed over the semiconductor substrate 102. The first and second base dielectric layers, 108a and 108b, vertically separate overlying devices from the semiconductor substrate 102. In some embodiments, the first and second base dielectric layers 108a, 108b may comprise an oxide. In some embodiments, a shallow trench isolation (STI) region 110 is disposed within the semiconductor substrate 102 in the memory contact pad region 102a. The STI region 110 includes a dielectric material or doped semiconductor material that provides isolation between neighboring devices.

The flash memory device region 104 comprises a pair of split-gate flash memory cells 111, respectively comprising a select gate (SG) 112 and a control gate (CG) 114 separated by a charge trapping layer 116. The charge trapping layer 116 extends between neighboring sidewalls of the SG 112 and the CG 114 and further extends below the CG 114. In one embodiment, charge trapping layer 116 includes a charge trapping silicon nitride layer sandwiched between two silicon dioxide layers to create a three-layer stack collectively and commonly referred to as "ONO." Other charge trapping dielectrics may include a silicon-rich nitride film or a layer of silicon nanoparticle dots, or any film that includes, but is not limited to, silicon, oxygen, and nitrogen in various stoichiometries. In some embodiments, the SG 112 and the CG 114 are composed of polysilicon. A silicide layer 118 is disposed within upper surfaces of the SG 112 and the CG 114. Spacer materials 120 are disposed along outer sidewalls of the CG 114 and sidewall spacers 122 are disposed along outer sidewalls of the SG 112, and along outer sidewalls of the spacer material 120. In some embodiments, sidewall spacers 122 and spacer material 120 comprise a nitride or an oxide.

The periphery circuit 106 comprises metal gates 124a (p-metal) and 124b (n-metal), arranged over a high-k dielectric 126. Sidewall spacers 122 are arranged over the semiconductor substrate 102, extending along outer sidewalls of the metal gates 124a, 124b, and along outer sidewalls of the high-k dielectric 126. Source/drain regions 128 are disposed within the semiconductor substrate 102 on opposite sides of the high-k dielectric 126. Silicide contact pads 130 are disposed above the source/drain regions 128. Contacts 132 extend on to the silicide contact pads 130 and the silicide layer 118. The silicide contact pads 130 and the silicide layer 118, reduce contact resistance of the contacts 132. An inter-layer dielectric (ILD) layer 134 is disposed laterally between the different devices. In some embodiments, the ILD layer 134, the spacer material 120 and the sidewall spacers 122 comprise SiON (silicon oxy-nitride), SiO2 (silicon dioxide), or SiN (silicon nitride).

As can be observed, the silicide layer 118 is separated from the charge trapping layer 116 by the polysilicon in the CG 114. In some embodiments, the silicide layer 118 within an upper surface of the CG 114 has a first thickness 136, which is smaller than a second thickness 138 of the polysilicon in the CG 114. A first upper surface 140 of the metal gates 124a, 124b, is lower than a second upper surface 142 of the silicide layer 118, by a vertical offset 144. Advantageously, the second thickness 138 of the CG 114 indicates that silicide layer 118 is formed in an upper region of the CG 114, mitigating leakage through silicide layer 118 into the semiconductor substrate 102.

Figure 2:
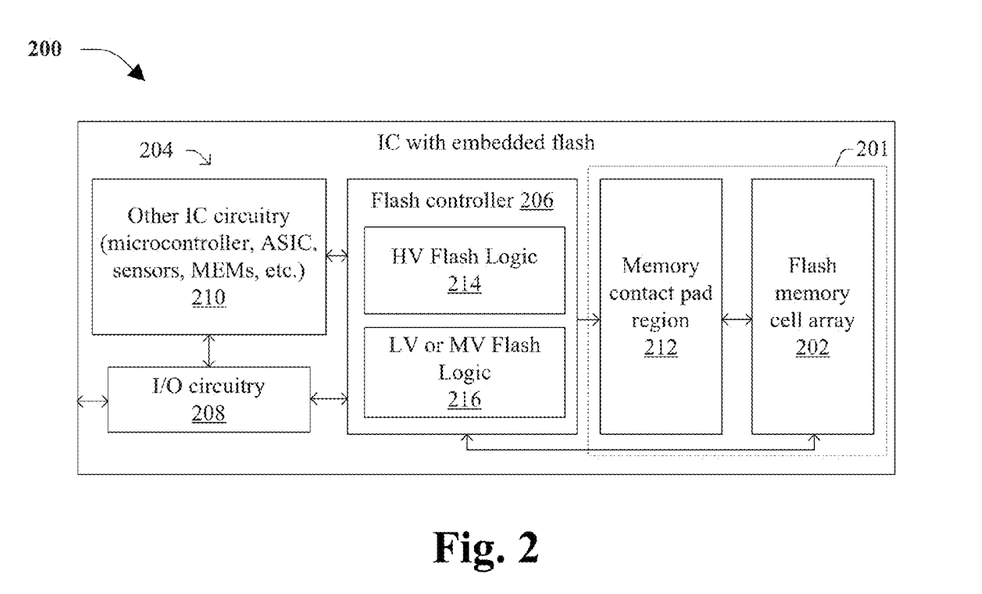
FIG. 2 illustrates a block diagram of some embodiments of an embedded flash memory device.

FIG. 2 illustrates some embodiments of an integrated circuit (IC) 200 which includes an embedded flash memory region 201 and a periphery circuitry 204.

The embedded flash memory region 201 (e.g., corresponding to memory contact pad region 102a) comprises a flash memory array 202 and a memory contact pad region 212. The flash memory array 202 comprises flash memory cells configured to store data. The memory contact pad region 212, which is distinct from cells of the flash memory array 202, can provide ohmic coupling between the flash memory array 202 and the periphery circuitry 204 (e.g., corresponding to periphery region 102b).

The periphery circuitry 204 comprises logic devices configured to support operation of the flash memory cells and/or provide other desired functionality. In FIG. 2's example, the periphery circuitry 204 includes a flash controller 206, input/output (I/O) circuitry 208, and other optional IC circuitry 210, such as microcontroller circuitry, application specific integrated circuit (ASIC) circuitry, sensors, and/or microelectromechanical systems (MEMS) for example. high voltage (HV) flash logic 214 and/or medium voltage (MV) or low-voltage (LV) flash logic 216 within flash controller 206. The memory cells of flash memory array 202 are localized to a memory region of the IC, and memory contact pad region 212 and logic devices of flash controller 206 are localized to a logic region of the IC, which is typically arranged around the periphery of the memory region.

Figure 3:
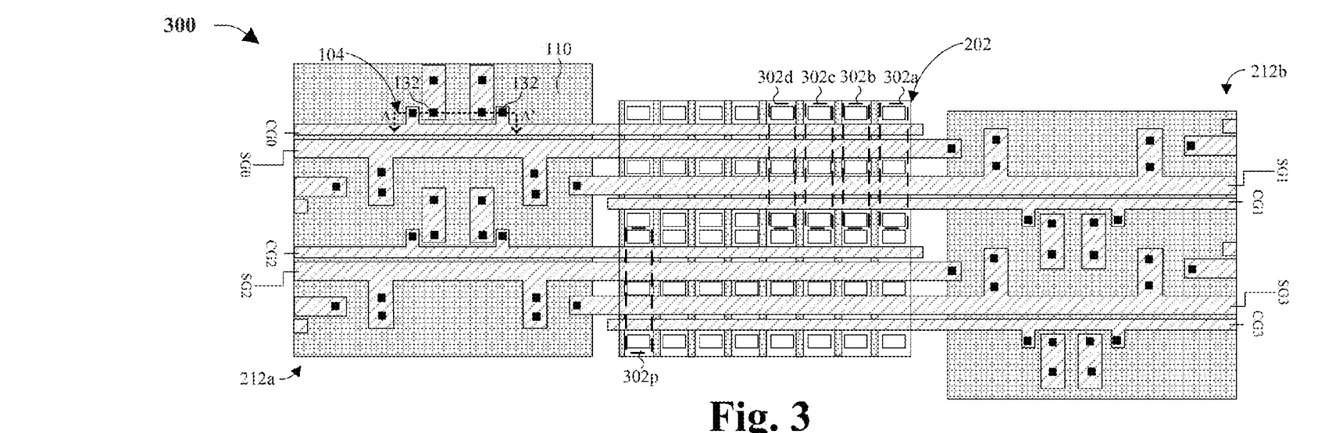
FIG. 3 illustrates a top-view of some embodiments of an embedded flash memory device.

With reference to FIG. 3, some embodiments of a sample layout view 300 of the memory contact pad region 212 and flash memory array 202 is provided.

The flash memory array 202 comprises a plurality of flash memory cells 302a-302p. Control gates (CGx) and select gates (SGx) extend between flash memory cells 302 arranged in rows within the flash memory array 202. The select gates and the control gates extend to a upper and lower memory contact pad regions 212a, 212b, which comprise contacts 132 configured to make an electrical connection to overlying metal interconnect layers.

It will be appreciated that for purposes of simplicity, the illustrated flash memory array 202 is shown as being made up of sixteen pairs of split gate flash cells 302a-302p. However, other flash memory arrays can be made up of different numbers of split gate flash cells (e.g., only a single flash memory cell or as many as a million memory cells, a billion memory cells, etc). Further, although two distinct memory contact pad regions—namely upper and lower memory contact pad regions 212a, 212b—are shown, other devices can include only a single memory contact pad region or can include more than two memory contact pad regions. Thus, the illustrated layout is just an example, and is not to be limiting of the present concept. The flash memory device region 104 is a cross-sectional view along AA' of the upper memory contact pad region 212a.

Figure 4:
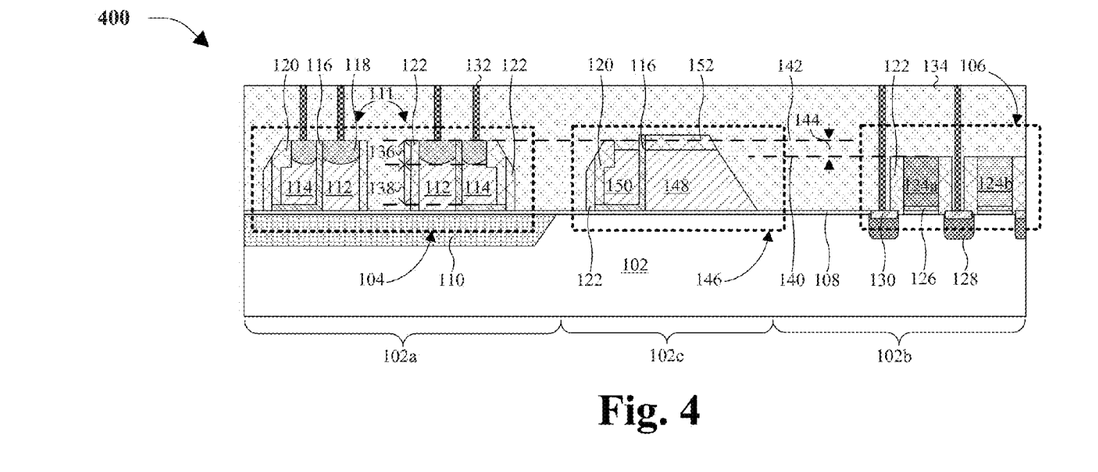
FIG. 4 illustrates a cross-sectional view of an integrated circuit, including a flash memory device region, a dummy region and a periphery region, according to some embodiments of the present disclosure.

With reference to FIG. 4, a cross-sectional view 400 of an IC including, one or more dummy structures 146 in the dummy region 102c is provided, according to some embodiments of the present disclosure. The one or more dummy structures 146 include, an electrically inactive select gate (SG) 148, an electrically inactive control gate (CG) 150 and a charge trapping layer 116 arranged between neighboring sidewalls of the electrically inactive select gate 148 and control gate 150. Spacer material 120 and sidewall spacer 122 are arranged along outer sidewall of the electrically inactive control gate 150.

A SiN (silicon nitride) hard mask 152 is disposed over the electrically inactive select gate 148 and control gate 150 respectively. In some embodiments, an upper surface of the silicide layer 118 is substantially aligned with an upper surface of the hard mask layer overlying control gate 150, while an upper surface of the SiN hard mask 152 overlying control gate 148 vertically overlies an upper surface of the silicide layer 118. In some embodiments, the electrically inactive select gate 148 has a tapered sidewall facing the periphery circuit 106. The one or more dummy structures 146, is a distinguishing structural feature that separates the flash memory device region 104 and the periphery circuit 106.

Figure 5:
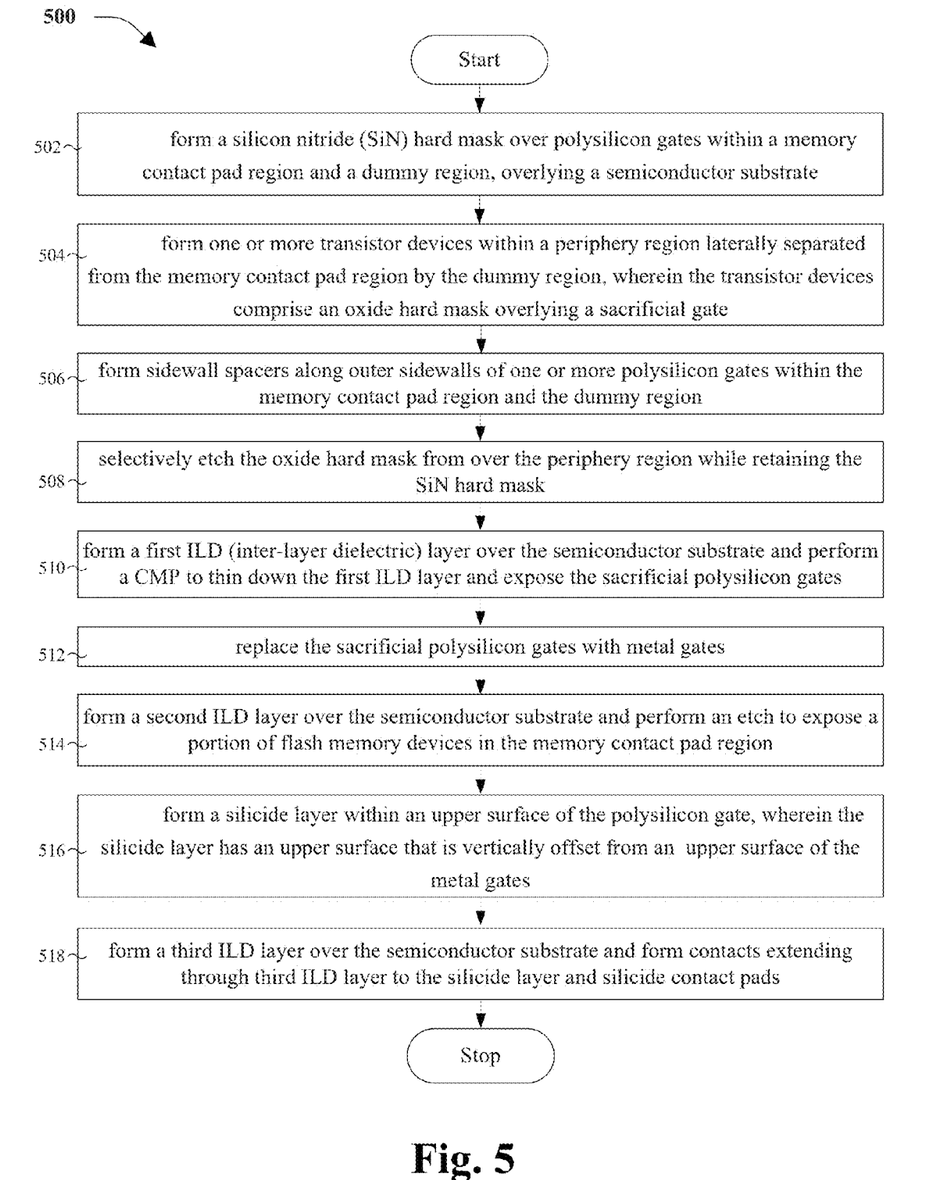
FIG. 5 illustrates a flow chart of some embodiments of a method of manufacturing an integrated circuit, according to the present disclosure.

With reference to FIG. 5, a flowchart of some embodiments of a method 500, for manufacturing an integrated circuit, formed according to some embodiments of the present disclosure is provided.

At 502, a silicon nitride hard mask is formed over polysilicon gates within a memory contact pad region and a dummy region, overlying a semiconductor substrate.

At 504, one or more transistor devices are formed within a periphery region, laterally separated from the memory contact pad region by the dummy region, wherein the transistor devices comprise and oxide hard mask overlying a sacrificial gate.

At 506, sidewall spacers are formed along outer sidewalls of one or more polysilicon gates within the memory contact pad region and the dummy region.

At 508, the oxide hard mask from the periphery region is selectively etched, while retaining the silicon nitride hard mask.

At 510, a first ILD (inter-layer dielectric) layer is formed over the semiconductor substrate and a CMP (chemical mechanical polishing) is performed to thin down the first ILD layer and expose the sacrificial polysilicon gates.

At 512, the sacrificial polysilicon gates are replaced with metal gates.

At 514, a second ILD layer is formed over the semiconductor substrate and an etch is performed to expose a portion of flash memory devices in the memory contact pad region.

At 516, a silicide layer is formed within an upper surface of the polysilicon gate. Formation of the silicide layer causes an upper surface of the silicide layer to be vertically offset from an upper surface of the metal gates.

At 518, a third ILD layer is formed over the semiconductor substrate and contacts are formed extending through the third ILD layer to the silicide layer and silicide contact pads.

Advantageously, by retaining the SiN hard mask over the flash memory devices in the memory contact pad region, control gates (CG) of the flash memory devices can be protected during the CMP process. This ensures that the silicide layer is not formed completely along a length of the CG, thereby reducing leakage of current through the silicide of the CG.

While the disclosed method 500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 6 through 14, cross-sectional views of some embodiments of an integrated circuit at various stages of manufacture are provided to illustrate the method of FIG. 5. Although FIGS. 6 through 14 are described in relation to the method 500, it will be appreciated that the structures disclosed in FIGS. 6 through 14 are not limited to the method 500, but instead may stand alone as structures independent of the method 500. Similarly, although the method 500 is described in relation to FIGS. 6 through 14, it will be appreciated that the method 500 is not limited to the structures disclosed in FIGS. 6 through 14, but instead may stand alone independent of the structures disclosed in FIGS. 6 through 14.

Figure 6:
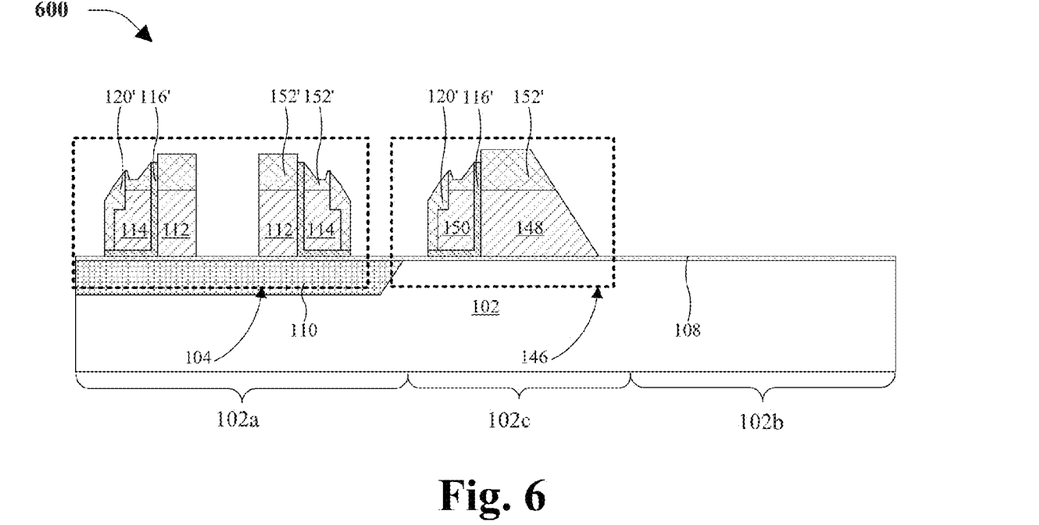
FIGS. 6-14 illustrate cross-sectional views of some embodiments of an integrated circuit, at various stages of manufacture, provided to illustrate the method of FIG. 5.

FIG. 6 illustrates a cross-sectional view 600 of some embodiments corresponding to Act 502 of FIG. 5.

As illustrated by FIG. 6, a silicon nitride (SiN) hard mask 152' is formed over polysilicon gates (SG 112 and CG 114) within a pair of flash memory cells 111 in a flash memory device region 104. The flash memory device region 104 overlies a semiconductor substrate 102 in a memory contact pad region 102a. In some embodiments, the semiconductor substrate 102 can be a Si, SiC (silicon carbide), or sapphire substrate. In some embodiments, the semiconductor substrate 102 comprises a silicon wafer with its crystalline structure terminating on a (111) lattice plane. In other embodiments, the semiconductor substrate 102 can be a sapphire wafer, a silicon-carbide wafer, or a silicon-on-insulator (SOI) wafer.

The SiN hard mask 152' is also formed over polysilicon gates (electrically inactive SG 148 and electrically inactive CG 150) of one or more dummy structures 146 in a dummy region 102c. Spacer material 120' abuts outer sidewalls of the CG 114 and electrically inactive CG 150. In some embodiments, the spacer material 120' comprises SiN. Charge trapping layer 116' is arranged between neighboring sidewalls of the CG 114 and SG 112, as well as between the electrically inactive SG 148 and electrically inactive CG 150. The charge trapping layer 116' further extends below the CG 114 and below the electrically inactive CG 150. In one embodiment, charge trapping layer 116' includes a charge trapping silicon nitride layer sandwiched between two silicon dioxide layers to create a three-layer stack collectively and commonly referred to as "ONO." Other charge trapping dielectrics may include a silicon-rich nitride film or a layer of silicon nanoparticle dots, or any film that includes, but is not limited to, silicon, oxygen, and nitrogen in various stoichiometries. A base dielectric layer 108 vertically separates overlying devices from the semiconductor substrate 102. In some embodiments, the base dielectric layer 108 comprises SiO2 (silicon dioxide). An STI region 110 formed within the semiconductor substrate 102 provides electrical isolation to the flash memory cells 111 in the flash memory device region 104, from neighboring devices.

Figure 7:
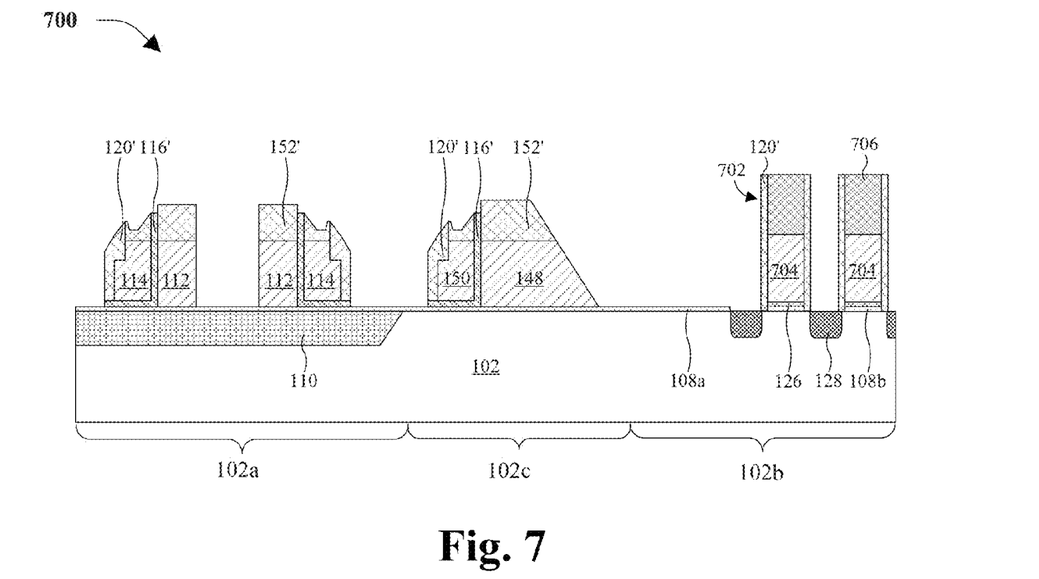

FIG. 7 illustrates a cross-sectional view 700 of some embodiments corresponding to Act 504 of FIG. 5.

As illustrated by FIG. 7, one or more transistor devices 702 are formed within a periphery region 102b, laterally separated from the flash memory device region 104 by the dummy region 102c. The transistor devices 702 comprise a sacrificial gate 704 and an oxide hard mask 706 that overlies the sacrificial gate 704. The sacrificial gate 704 is disposed over a high-k dielectric 126. In some embodiments, the sacrificial gate 704 comprises polysilicon and the oxide hard mask 706 comprises SiO2. In some embodiments, the high-k dielectric 126 comprises HfO (hafnium oxide), HfSiO (hafnium silicon oxide), HfAlO (hafnium aluminum oxide), or HfTaO (hafnium tantalum oxide). The sacrificial gate 704, the oxide hard mask 706, and the high-k dielectric 126 may be formed by a deposition process (e.g., PVD, CVD, PECVD, etc.) followed by a patterning process (e.g., an etching process according to a patterned masking layer).

Spacer materials 120' are formed on opposite sidewalls of the sacrificial gate 704 and on opposite sidewalls the oxide hard mask 706. Source/drain regions 128 are formed within the semiconductor substrate 102 on opposing sides of the high-k dielectric 126. In some embodiments, the source/drain regions 128 are formed by removing a portion of the base dielectric layer 108 gets etched away to form a first base dielectric layer 108a and a second base dielectric layer 108b underlying the high-k dielectric 126. One or more dopant species (e.g., boron, phosphorous, etc.) are subsequently implanted into unmasked regions of the semiconductor substrate 102

Figure 8:
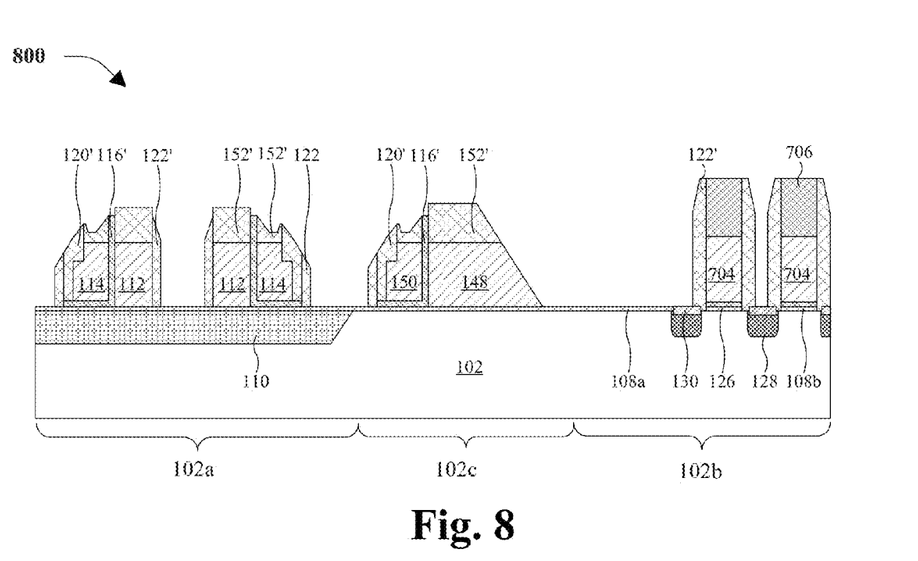

FIG. 8 illustrates a cross-sectional view 800 of some embodiments corresponding to Act 506 of FIG. 5.

As illustrated by FIG. 8, sidewall spacers 122 and 122' are formed along outer sidewalls of the spacer material 120' and along outer sidewalls of the SG 112 respectively. Sidewall spacers 122' are also formed extending along outer sidewalls of the sacrificial gates 704 and oxide hard masks 706. In some embodiments, the sidewall spacers 122 and 122' may be formed by depositing a nitride and selectively etching the nitride to form the sidewall spacers 122 and 122'. In some embodiments, the sidewall spacers 122 and 122' comprise SiN.

Figure 9:
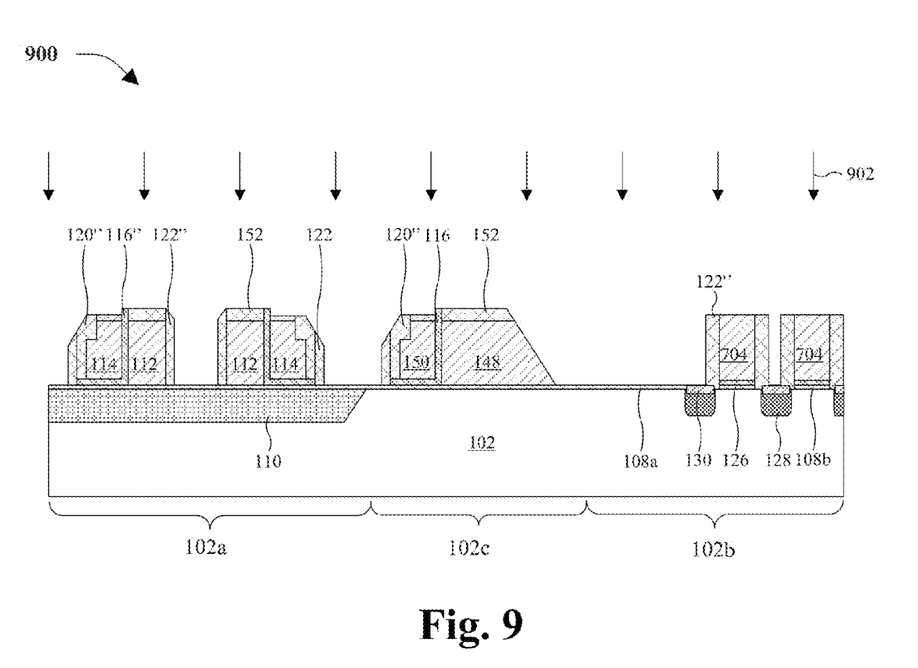

FIG. 9 illustrates a cross-sectional view 900 of some embodiments corresponding to Act 508 of FIG. 5.

As illustrated by FIG. 9, a first etch 902 is performed to selectively remove the oxide hard mask 706, while retaining the silicon nitride hard mask 152 over the polysilicon gates (SG 112, CG 114, electrically inactive SG 148 and electrically inactive CG 150). In various embodiments, the first etch 902 may be performed using a dry etchant (e.g., an RIE etch, a plasma etch, etc.) or a wet etchant (e.g., hydrofluoric acid). The contours of the sidewall spacers 122' have been changed to 122'' and that of the SiN hard mask 152' have been changed to 152. It will be appreciated that the contours of the sidewall spacers 122'' and the SiN hard mask 152 can take various forms depending on the etch conditions used.

Figure 10:
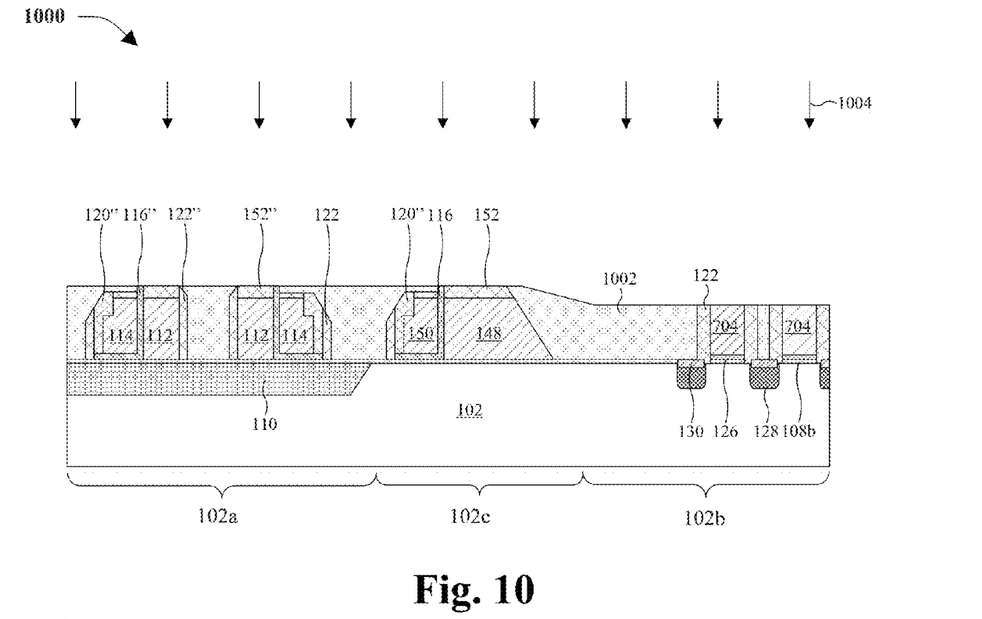

FIG. 10 illustrates a cross-sectional view 1000 of some embodiments corresponding to Act 510 of FIG. 5.

As illustrated by FIG. 10, a first ILD (inter-layer dielectric) layer 1002 is formed over the semiconductor substrate 102. Following that, a CMP (chemical mechanical polishing) process 1004 is performed, to thin down the ILD layer 1002 and expose the sacrificial gates 704. It will be appreciated that, due to difference in hardness between the SiN hard mask 152' and 152 and the sacrificial gate 704, the CMP process 1004 will result in a non-planar surface, which has an upper surface of the SiN hard mask 152 overlying an upper surface of the sacrificial gates 704. This is because the SiN hard mask 152 above the polysilicon gates (SG 112, CG 114, electrically inactive SG 148 and electrically inactive CG 150) protects them during the CMP process 1004.

Figure 11:
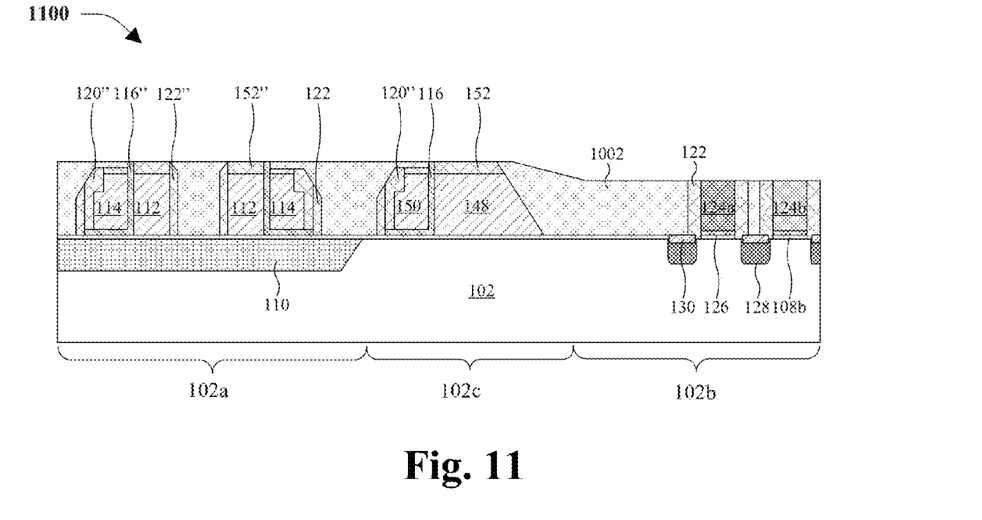

FIG. 11 illustrates a cross-sectional view 1100 of some embodiments corresponding to Act 512 of FIG. 5.

As illustrated by FIG. 11, the sacrificial gates 704 are replaced with metal gates 124a (p-metal) and 124b (n-metal). A process where polysilicon gates are replaced with metal gates is known as replacement gate (RPG) process. During the RPG process, a second hard mask layer (not shown) covers the rest of the integrated circuit, while the sacrificial polysilicon from the sacrificial gates 704 is stripped/etched away to form recesses. The second hard mask stays during deposition of the corresponding metal (124a, 124b) in the corresponding recesses as well. After the metal gates 124a and 124b are deposited, another CMP process is performed to remove excess metal gate material and the second hard mask layer.

Figure 12:
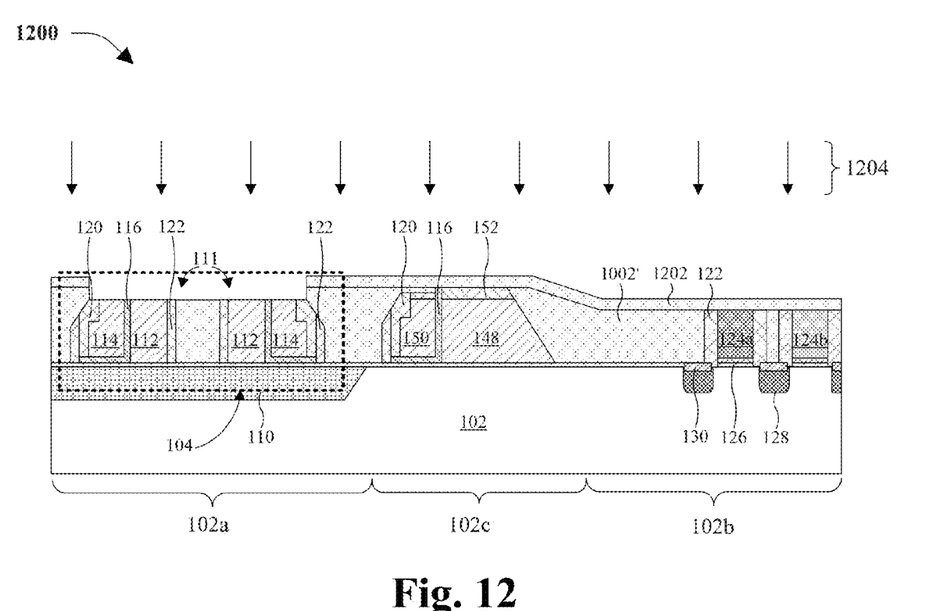

FIG. 12 illustrates a cross-sectional view 1200 of some embodiments corresponding to Act 514 of FIG. 5.

As illustrated by FIG. 12, a second ILD layer 1202 is formed over the semiconductor substrate 102 and a second etch 1204 is performed to expose a portion of the flash memory cells 111 in the flash memory device region 104. In various embodiments, the second etch 1204 may be performed using a dry etchant (e.g., an RIE etch, a plasma etch, etc.) or a wet etchant (e.g., hydrofluoric acid). In some embodiments, the second etch 1204 includes, forming a second mask (not shown) over the semiconductor substrate, the second mask having an opening that exposes a portion of the flash memory cells 111, and performing a time controlled etch that etches away SiN hard mask 152, the charge trapping layer 116, and the first and second ILD layers 1002 and 1202 respectively, and stops at polysilicon. The second etch 1204 changes the contours of, the first ILD layer 1002, the sidewall spacers 122'', and the charge trapping layer 116', to 1002', 122 and 116 respectively. In some embodiments, the second ILD layer 1202 comprises silicon dioxide or a low-k dielectric.

Figure 13:
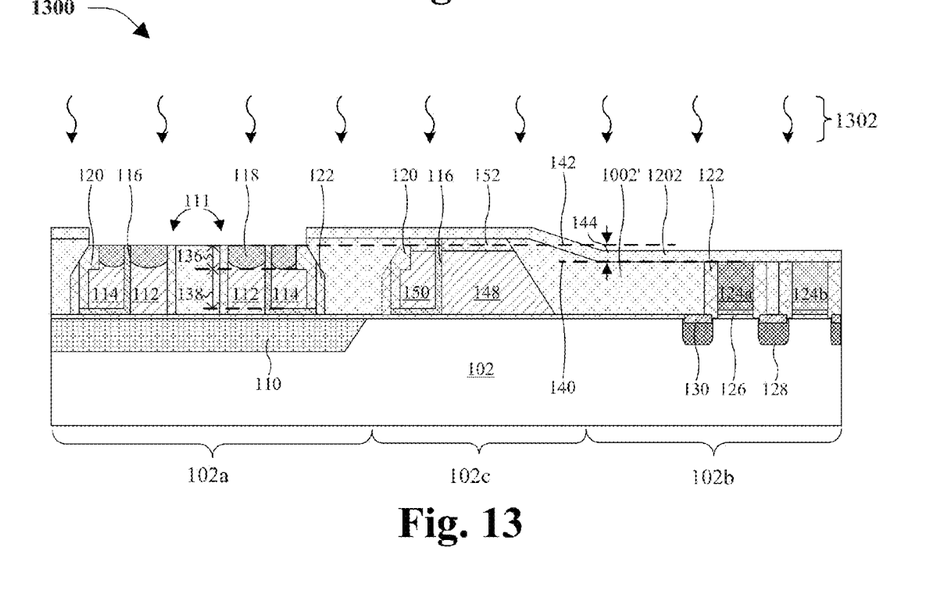

FIG. 13 illustrates a cross-sectional view 1300 of some embodiments corresponding to Act 516 of FIG. 5.

As illustrated by FIG. 13, a silicide layer 118 is formed within an upper surface of the polysilicon gates (SG 112 and CG 114). In some embodiments, the silicide layer 118 comprises nickel silicide, cobalt silicide, or titanium silicide, which is formed by depositing a transition metal layer 1302 that includes a transition metal such as Ni (nickel), Co (cobalt), Ti (titanium) etc., followed by an annealing process. The silicide layer 118 has a second upper surface 142 that is vertically offset from a first upper surface 140 of the metal gates (124a, 124b). The vertical offset is represented by reference numeral 144. In some embodiments, the vertical offset 144 ranges between approximately 50 angstroms and approximately 500 angstroms.

In some embodiments, the silicide layer 118 over the CG 114 has a first thickness 136, which is smaller than a second thickness 138 of the polysilicon of the CG 114. Advantageously, the second thickness 138 of the CG 114 indicates that silicide layer 118 is formed within an upper surface of the CG 114 separated from the charge trapping layer 116, which mitigates the probability of current leaking through the silicide layer 118 into the semiconductor substrate 102.

Figure 14:
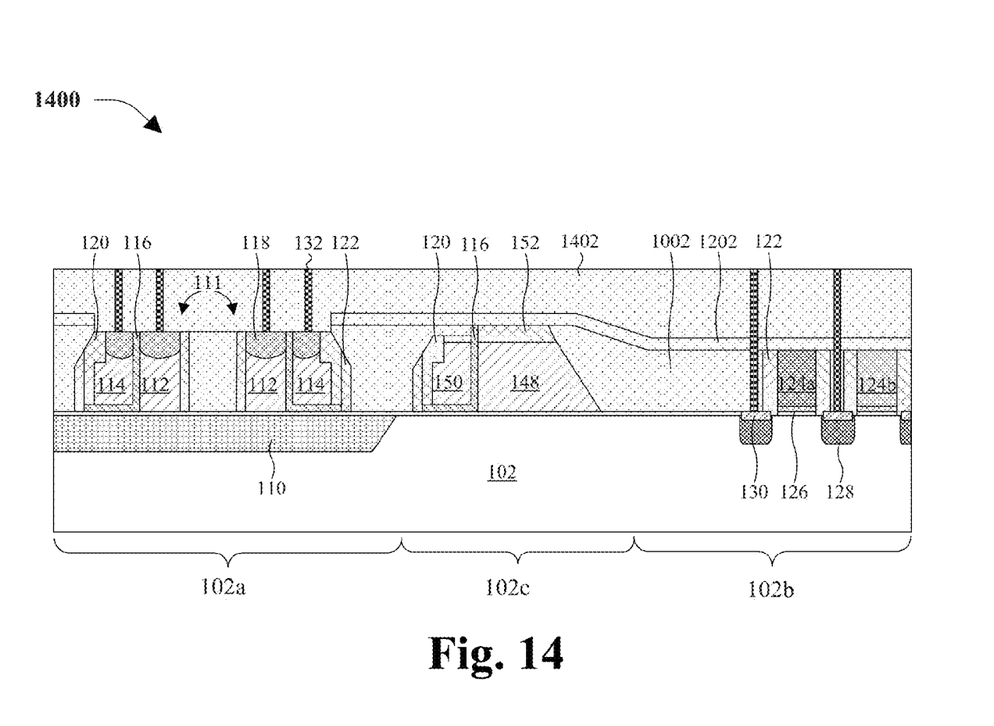

FIG. 14 illustrates a cross-sectional view 1400 of some embodiments corresponding to Act 518 of FIG. 5.

As illustrated by FIG. 14, a third ILD layer 1402 is formed over the semiconductor substrate 102. Contacts 132 are then formed, extending through the third ILD layer 1402 to the silicide layer 118 and the silicide contact pads 130. In some embodiments, the contacts 132 comprise a metal, such as copper, gold, or tungsten. In some embodiments, the contacts 132 are formed by performing a patterned etch to create openings in the first, second and third ILD layers 1002, 1202 and 1402 respectively, followed by filling the openings with a metal. In some embodiments, the third ILD layer 1402 comprises silicon dioxide or a low-k dielectric.

Thus, as can be appreciated from above, the present disclosure is directed to an improved structure and method of manufacturing an embedded flash memory cell that limits thinning of a CG region to prevent leakage.

In some embodiments, the present disclosure provides an integrated circuit (IC), comprising a flash memory device region having a pair of split-gate flash memory cells arranged over a semiconductor substrate. The pair of split gate flash memory cells respectively have a control gate (CG) comprising a polysilicon gate and an overlying silicide layer. A periphery circuit comprising, one or more high-k metal gate (HKMG) transistors are arranged over the semiconductor substrate at a position laterally offset from the flash memory device region. The one or more HKMG transistors have a metal gate electrode with an upper surface that is lower than an upper surface of the silicide layer.

In other embodiments, the present disclosure provides a method of forming an integrated circuit (IC), comprising, forming a silicon nitride hard mask over polysilicon gates within an embedded flash memory device region overlying a semiconductor substrate. One or more HKMG transistor devices are formed over the semiconductor substrate in a periphery region laterally separated from the embedded flash memory device region. The one or more HKMG transistor devices respectively comprise a metal gate electrode. A silicide layer within an upper surface of the polysilicon gates is also formed. The silicide layer has an upper surface that vertically overlies an upper surface of the metal gate electrode.

In yet other embodiments, the present disclosure provides an integrated circuit (IC) comprising, a flash memory device region and a periphery region separated by a dummy region. A pair of split-gate flash memory cells including a control gate (CG) comprising a polysilicon layer and an overlying silicide layer is disposed over the flash memory device region. A thickness of the CG is greater than a thickness of the silicide layer. A HKMG (high-k metal gate) logic circuit is disposed over the periphery region, having a HKMG transistor device with a gate electrode having an upper surface that is vertically below an upper surface of the silicide layer is also arranged over the semiconductor substrate. A dummy structure is positioned between the pair of split-gate flash memory cells and the HKMG logic circuit. A silicon nitride (SiN) hard mask is disposed on an upper surface of the dummy structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a flash memory device region comprising a pair of split-gate flash memory cells arranged over a semiconductor substrate, wherein the pair of split gate flash memory cells respectively have a control gate (CG) comprising a polysilicon gate and an overlying silicide layer; and
a periphery circuit comprising one or more high-k metal gate (HKMG) transistors arranged over the semiconductor substrate at a position laterally offset from the flash memory device region and respectively comprising:
a high-k dielectric layer disposed between the semiconductor substrate and a metal gate electrode;
a sidewall spacer extending along an outer sidewall of the metal gate electrode and the high-k dielectric layer, wherein an uppermost surface of the sidewall spacer is lower than an upper surface of the silicide layer; and
a dummy region laterally disposed between the memory region and the periphery circuit, wherein the dummy region comprises an electrically inactive select gate, an electrically inactive control gate, and a hard mask layer disposed over the electrically inactive select gate, wherein an upper surface of the hard mask layer overlies an upper surface of the silicide layer.

2. The IC of claim 1, wherein the pair of split-gate flash memory cells, respectively comprise:
a select gate (SG); and
a charge-trapping layer arranged between the CG and the SG, wherein the charge-trapping layer extends under the CG.

3. The IC of claim 2, wherein sidewalls of the silicide layer and the polysilicon gate abut the charge-trapping layer.

4. The IC of claim 3, wherein a thickness of the silicide layer over the CG is smaller than a thickness of the CG.

5. The IC of claim 2, further comprising:
silicide contact pads disposed within an upper region of the semiconductor substrate and on opposing sides of the high-k dielectric layer; and
contacts extending on to the silicide contact pads and the silicide layer, wherein the silicide layer is disposed over upper surfaces of the CG and the SG.

6. The IC of claim 5, wherein the upper surface of the silicide layer vertically overlies the uppermost surface of the metal gate electrode by a range of between approximately 50 angstroms and approximately 500 angstroms.

7. An integrated circuit (IC) comprising:
a substrate comprising a flash memory device region and a periphery region laterally separated by a dummy region;

a pair of split-gate flash memory cells disposed over the flash memory device region and including a control gate (CG) comprising a polysilicon layer and an overlying silicide layer;

a HKMG (high-k metal gate) logic circuit disposed over the periphery region;

a dummy structure disposed over the dummy region, wherein a hard mask is disposed on an upper surface of the dummy structure;

a first inter-level dielectric (ILD) layer disposed between the dummy structure and the HKMG logic circuit, wherein the first ILD layer has an upper surface that is non-planar;

a second ILD layer disposed over the first ILD layer, wherein the second ILD layer has an upper surface that is non-planar; and a third ILD layer disposed over the second ILD layer, wherein the third ILD has a bottom surface that is non-planar and a top surface that is planar.

8. The IC of claim 7, wherein the pair of split-gate flash memory cells, respectively comprise:

a select gate (SG); and a charge-trapping dielectric layer arranged between the CG and the SG, wherein the charge-trapping dielectric layer extends under the CG.

9. The IC of claim 7, wherein a thickness of the CG is greater than a thickness of the silicide layer.

10. The IC of claim 7, wherein the HKMG logic circuit comprises a HKMG transistor device with a gate electrode having an upper surface that is vertically below an upper surface of the silicide layer.

11. The IC of claim 7, wherein an upper surface of the silicide layer overlies an upper surface of the dummy structure and underlies an upper surface of the hard mask.

12. The IC of claim 7, wherein the dummy structure comprises:

an electrically inactive select gate (SG);

an electrically inactive control gate (CG); and a second charge trapping dielectric layer arranged between the electrically inactive select gate and the electrically inactive control gate and below the electrically inactive control gate.

13. The IC of claim 12, wherein the second charge trapping dielectric layer has an upper surface that overlies an upper surface of the electrically inactive select gate.

14. The IC of claim 1, further comprising:

a charge-trapping layer arranged between neighboring sidewalls of the electrically inactive select and control gates; and a sidewall spacer abutting an outer sidewall of the electrically inactive control gate.

15. An integrated circuit (IC), comprising:

a flash memory device region comprising a pair of split-gate flash memory cells arranged over a semiconductor substrate, wherein the pair of split gate flash memory cells respectively have a control gate (CG) comprising a polysilicon gate and an overlying silicide layer;

a periphery circuit comprising one or more high-k metal gate (HKMG) transistors arranged over the semiconductor substrate at a position laterally offset from the flash memory device region, wherein the one or more HKMG transistors have a metal gate electrode with an upper surface that is lower than an upper surface of the silicide layer;

one or more dummy structures laterally disposed between the flash memory device region and the periphery circuit, wherein upper surfaces of the dummy structures include a hard mask and wherein the one or more dummy structure comprise:

an electrically inactive select gate;

an electrically inactive control gate;

a charge-trapping layer arranged between neighboring sidewalls of the electrically inactive select and control gates; and a sidewall spacer abutting an outer sidewall of the electrically inactive control gate.

16. The IC of claim 1, wherein the uppermost surface of the sidewall spacer corresponds to the uppermost surface of the metal gate electrode; and wherein the uppermost surface of the metal gate electrode is lower than the upper surface of the silicide layer.

17. The IC of claim 14, wherein the charge trapping layer has an upper surface that overlies an upper surface of the electrically inactive select gate.

18. The IC of claim 1, wherein the upper surface of the silicide layer overlies an upper surface of the electrically inactive select gate.

19. The IC of claim 15, wherein the charge trapping dielectric layer has an upper surface that overlies an upper surface of the electrically inactive select gate.

20. The IC of claim 15, wherein a thickness of the CG is greater than a thickness of the silicide layer.

* * * * *